United States Patent
Ichida et al.

(10) Patent No.: US 6,518,667 B1
(45) Date of Patent: Feb. 11, 2003

(54) SEMICONDUCTOR PACKAGE USING MICRO BALLS AND PRODUCTION METHOD THEREOF

(75) Inventors: Akira Ichida, Toyama (JP); Hiroshi Yoshida, Toyama (JP); Masahiko Mizukami, Toyama (JP); Yoshihiko Doi, Chiba (JP)

(73) Assignee: Allied Material Corporation, Tokyo (JP)

( * ) Notice: Subject to any disclaimer, the term of this patent is extended or adjusted under 35 U.S.C. 154(b) by 1 day.

(21) Appl. No.: 09/697,158

(22) Filed: Oct. 27, 2000

(30) Foreign Application Priority Data

Feb. 29, 2000 (JP) ........................................ 2000-054219
Jul. 14, 2000 (JP) ........................................ 2000-214982

(51) Int. Cl.$^7$ .............................................. H01L 23/48
(52) U.S. Cl. ........................................ 257/738; 257/734
(58) Field of Search ................................ 257/738, 734; 428/570; 382/750; 438/626, 14

(56) References Cited

U.S. PATENT DOCUMENTS

| | | | | |
|---|---|---|---|---|
| 6,037,065 A | * | 3/2000 | Hajmrle et al. ............. | 428/570 |
| 6,130,959 A | * | 10/2000 | Li ............................... | 382/150 |
| 6,136,689 A | * | 10/2000 | Farrar ......................... | 438/626 |
| 6,158,644 A | * | 12/2000 | Brofman et al. ........... | 228/56.3 |
| 6,165,806 A | * | 12/2000 | Kuan ........................... | 438/14 |
| 6,313,532 B1 | * | 11/2001 | Shimoishizaka et al. ... | 257/734 |

OTHER PUBLICATIONS

Nakamura et al., "The Analysis of the Electroplating Bumps Formation", *Journal of Japan Institute of Electronics Packaging*, vol. 1, No. 1, 1998, pp. 41–46.
*Electronics Packaging Technology*, vol. 15, No. 7, 1999, pp. 52–63.
*Nikkei Microdevices*, Jan. 2000, pp. 148–153.
Kumagaya et al., *Summary of Japan Society of Powder and Powder Metallurgy*, 1993, p. 179.
Kumagaya et al., *Summary of Japan Society of Powder and Powder Metallurgy*, 1996, p. 180.
Hiroshi Kametani, "Fixed Electrode Polarization Phenomena in Suspension Electrode Electrolysis of Copper", *Electrochemistry*, vol. 41, No. 2, 1973, pp. 112–118.
Takeshima et al., "Determination of Most Electrolytic Cell Structure for Particle Plating", *Surface Technology*, vol. 41, No. 2, 1990, pp. 151–155.
Totan Products Information, P1, No. C025/Solder composite (copper–core) micro ball for electronic device. published by Tokyo Tungsten K.K., Nov. 16, 1999.

* cited by examiner

*Primary Examiner*—David Nelms
*Assistant Examiner*—Thinh Nguyen
(74) *Attorney, Agent, or Firm*—Sughrue Mion, PLLC

(57) ABSTRACT

In a package of a semiconductor device mounted a semiconductor element and micro balls as electric contact points, the micro balls are composed of composite micro balls each of which has a core ball and an electrically conductive film around the core ball. The core balls have a sufficient rolling property with the diameter ranged from 30 to 100 μm. The diameter accuracy thereof is excellent. The electrically conductive film is formed by a solder plated layer which has a thickness of at least 10 μm uniformly formed on the outer surfaces. The composite micro balls are mounted onto a substrate. The dimensional accuracy of the Z axis of the package can be precisely controlled. Accordingly, the composite micro balls with the solder plated film has a thickness of at least 20 μm on the outer circumference of each core ball. The production method thereof, and the semiconductor package mounted a semiconductor element using the composite micro balls can be provided.

16 Claims, 9 Drawing Sheets

(2 of 9 Drawing Sheet(s) Filed in Color)

MICROBALL OF THIS INVENTION

PARTICLE SIZE DISTRIBUTION OF HIGH-ACCURACY Cu BALLS

APPEARANCE

CROSS SECTION
(SOLDER PLATING/COPPER-CORE BALL)

MICROBALL OF THIS INVENTION

SOLDER BALL OF PRIOR ART

BEFORE REFLOW

PITCH 150 μm   LAND φ 80 μm

AFTER REFLOW

REFLOW CONDITIONS:
   TEMPERATURE: 250°C
   ATMOSPHERE: Ar
   RETENTION TIME: 30 SECONDS

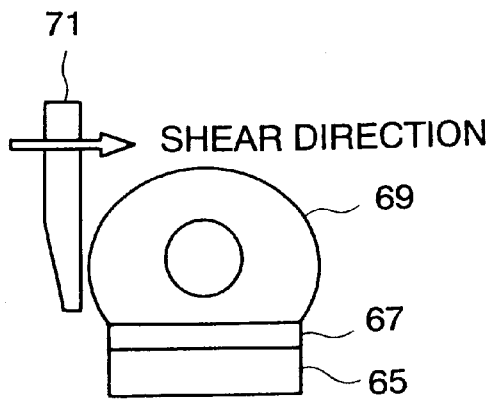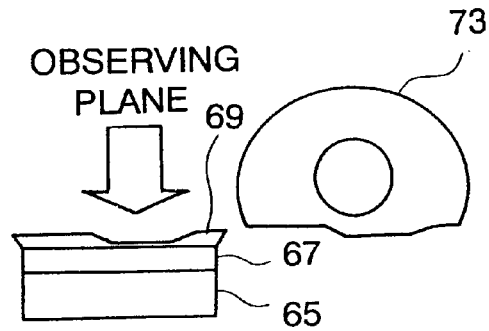
FIG. 11A   FIG. 11B
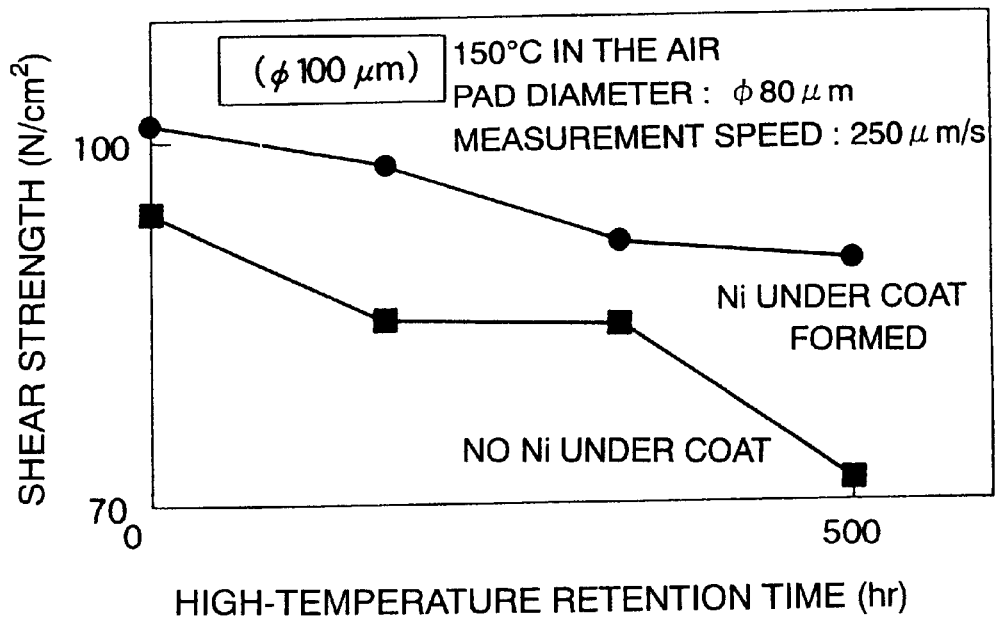
FIG. 12

SEMICONDUCTOR PACKAGE USING MICRO BALLS AND PRODUCTION METHOD THEREOF

BACKGROUND OF THE INVENTION

The present invention relates to a semiconductor package, such as a flip chip package (FC-PKG) including a flip chip ball grid array (FC-BGA) and a method of manufacturing the semiconductor package. More specifically, the present invention relates to an inside electrode used in the semiconductor package and to a method of manufacturing the inside electrodes. It is to be noted throughout the instant specification that the inside electrodes are formed by balls and are also used in a prober for investigating a semiconductor device.

With the development of recent multimedia, a system using a silicon device tends to show high speed and high performance. However, it is becoming difficult more and more to sufficiently obtain the high performance of the device by packaging a silicon device and mounting the packaged device on a printed substrate only by a conventional method.

Specifically, even when the signal processing is carried out at a high speed, such a high-speed operation is restrained due to a delay of the signal propagation of a package and on a printed substrate and due to an error operation caused by a crosstalk noise.

Also, since the scale of LSI is increased and the performance thereof becomes higher, various difficult problems take place in the case of packaging and mounting LSI chips such that the number of I/O pins is increased. In addition, any other problems also take place such that the I/O pins become area arrays and heating from the chip is increased.

In such circumstances, the improvements of various mounting techniques are proposed as a new high-density mounting technique. As the techniques for supporting the improvements, the techniques of a chip size package (CSP) and a bear chip mount are largely developed. Particularly, in a technique of bonding a silicon chip (the chip is usually a silicon chip) to a surrounding material such as a substrate, flip chip mounting would be helpful. This is because such flip chip mounting makes it possible to reflow in a lump and to easily accomplish a desirable reliability. Moreover, there is a possibility that the flip chip mounting becomes particularly the inevitable technique in a next generation high-density package, etc.

Also, as the performance is increased and semiconductor devices are down-sized, it is required that a semiconductor package also becomes small in size and light in weight.

Herein, the flip chip mounting or connecting technique is helpful to connect a substrate and a chip in a lump by the use of protrusion electrodes (called bumps) on the chips. With this technique, it is possible to satisfy the requirements of increasing the number of pins of the I/O terminals (terminals of the inlet and outlet of circuit) and shortening the signal delayed time.

At any rate, a high-functional semiconductor device is manufactured by an electrolytic plating method, a vacuum vapor deposition method, and/or stud bump forming using a wire bonding method.

In these methods, particularly, the electrolytic plating method can simultaneously form all the bumps on a flat plane and is therefore considered to be relatively inexpensive as compared with other methods, and to be excellent in mass production.

According to recent reports about the formation of bumps, an aperture of about 100 $\mu$m is plated and the plating condition is discussed on the region of the size of at least about 120 $\mu$m. In addition, the content relates to mushroom-type bumps (see, Electronics Jisso Gakkai Shi (Journal of Japan Institute of Electronics Packaging), Vol. 1, No. 1, page 41, 1998).

Alternatively, recent attention has been made about a flip chip connection technique by a compressing technique. That is, the technique is a flip chip mounting technique of adhering IC to a circuit substrate by using hardening resin like film or paste and keeping the electric connection by the residual stress in the resin. This technique has a merit in that the productivity is high as compared with the prior art.

There is a technique of using an anisotropic conductive film (ACF) but since a technique of using an anisotropic conductive paste (ACP) and a non-conductive resin paste (NCP) in a driver IC of LCD, the material cost is low as compared with the case of the above-described film and a sticking device is unnecessary, the latter technique is rapidly beginning to be propagated.

The techniques are excellent in the accuracy in position-alignment and the reproducibility. However, such excellent accuracy is accomplished only on a two-dimensional package in connection with the hardness of a substrate and the relative deformation of a chip and a substrate. In other words, it is clear that such excellent accuracy can not be achieved on a high- density package of a three dimensional structure to which attention will be directed in the future. Particularly, no improvement can be achieved along the Z-axis direction in the conventional methods and, therefore, the above-described technique will be brought to a standstill.

It can be easily anticipated that the bump pitch is, at present, from 200 to 250 $\mu$m, but it becomes 100 $\mu$m or lower. Thus, the mounting technique practically suitable in such a case and the supply of packages thereof will be demanded. A report about the recent compression technique mentions the consideration of the damage on a substrate and a chip and also the accuracy of the warp of a substrate (see, Electronics Jisso Gijutsu (Electronics Packaging Technology), Vol. 15, No. 7, page 52,1999).

In addition, it is predicted as a future technique that the above-described three-dimensional stack type will be mainly investigated for the high-density package of a small size. Stacking bear chips might be a final form but in this case, the problems remain in the use of a semiconductor process and the protection of the chip itself. Thus, the practical use will be directed to stacking the packages, which will be accelerated.

In such a stream of the technique, proposal has been made about using micro balls as contact materials in a C4 method (Controlled Collapsed Chip Connection/Flip Chip Attach), on mounting a chip and a substrate in a flip chip technique, In a flip chip connected CSP of prior art, a semiconductor chip is electrically connected to one surface of a wiring substrate having an electrically conductive pattern formed on the surface of a ceramic or synthetic resin substrate via micro balls called flip chip balls (FC-Ball). In this event, the connected portions between the semiconductor chip and the wiring substrate are covered with an insulating resin. On the other hand, the other surface side of the wiring substrate is mounted on one surface of a substrate or an electric part via micro balls called ball grid array balls (BGA-Ball).

Such micro balls provide an effective and reliable means for mounting, particularly, the chip and the substrate when the C4 method (Controlled Collapsed Chip Connection/Flip Chip Attach) or a technique of prior art similar to the C4 method is used.

On the other hand, Nikkei Microdevices, January, 2000, page 148, reports that a burn in inspection apparatus has been given attention as a recent technical trend of the inspecting technique in semiconductor devices. In such an apparatus also, each terminal of a probe must be certainly brought into contact with each electrode on a wafer. Otherwise, a serious problem is caused to occur. This means that such an apparatus should have a total high-accurate construction for obtaining the function as the probe, in addition to the dimensional accuracy of parts used. In particular, it is very important that alignment along the Z-axis direction must be matched between the substrate and the chip both of which are connected to each other.

Practically, it is devised that collapse of posts is utilized to absorb a variation of heights of electrodes and a spring-attached probe is used as the terminal, etc. However, a sufficient accuracy can not obtained in this probe.

Now, as the method of obtaining spherical shaped particles or grains having a uniform particle size such as the above-described micro balls, various methods are proposed. In these methods, as a method of obtaining good metal balls, a plasma rotary electrode method is said to be excellent. In the plasma rotary electrode method, the step of forming different particle sizes is also determined (Funtai Funmatu Yakin Kyokai Gaiyo Shuu (Summary of Japan Society of Powder and Powder Metallurgy), Kumagaya, et al, '96 & '93) and the investigation of forming uniform particle size has been carried out. Also, on the other hand, as an example of a substance having a high density, the case of copper has been investigated.

However, in the case of forming metal particles having particle sizes of not larger than 100 $\mu$m, the plasma rotary electrode method makes it difficult to obtain pore-free particles. This is because the particle size distribution is widely varied to make it substantially difficult to control the particle sizes in a posterior step. In addition, the molten metal is successively released from the unmolten material in the case of melting a material (ingot). As a result, it is supposed that the heat distribution of the material portion is largely changed due to every release of the melt, whereby the possibility of generating pores is said to be large.

Also, even when metal balls having particle sizes not larger than 100 $\mu$m can be formed, it is important that the size of the balls practically formed and the extent of the accuracy of the form of the metal balls can be correctly analyzed. For example, as described above, in the metal balls having the particle sizes not larger than 100 $\mu$m, and more specifically of from 30 to 100 $\mu$m, it is estimated to become a key to have a sufficient measurement accuracy of ±3 $\mu$m or more. Moreover, the extents of a recess and an irregular shape can fall within 3 $\mu$m at one side, but at present, the inspection/screening machine suitable for the level cannot be commercially available.

Furthermore, powdery particles applied with a soldering material, for example, applied with solder plating are considered to be considerably useful because the sufficient contact and fixing thereof are possible.

About the development of such a plating technique, a electrode electrolysis method by using a suspension of copper (Kametani, Denki Kagaku (Electrochemistry), 41, 2, page 112, 1973) and a fine particle electrolytic plating method (Takeshima, et al, Hyomen Gijitsu (Surface Technology), 41, 2, page 151, 1990) are investigated well. However, in these plating techniques, the improvement of the electric current efficiency is fundamentally and mainly considered and the properties of the plated films formed on the surfaces are not discussed.

In various plating methods, solder plating is assumed to apply to the micro balls. In this event, the solder plating has the faults that, even when the plated thickness is 5 $\mu$m or thinner, the plated layer becomes a crumbling layer or the balls become non-spherical balls or an irregular shape such that they do not roll. This is because the growth rate of the plating layer is non-uniform. In addition, the micro balls are often stuck to each other like a bunch of grapes.

In order to remove the above-described faults, there is a method of forming the film with particles kept in a floated state by an impeller (a stirrer with blade) or a vibrator. However, the method is disadvantageous in that each ball becomes a non-spherical shape.

SUMMARY OF THE INVENTION

It is an object of the present invention to provide core balls which have particle sizes not larger than 100 $\mu$m and which are excellent in a rolling property.

It is another object of the present invention to provide a method of manufacturing core balls as mentioned before.

Also, it is still an another object of the invention to provide composite balls made of the above-described core balls having formed on the surfaces soldering layer of a thickness of at least 20 $\mu$m.

Also, it is yet another object of the invention to provide a production method of the above-described composite balls.

Furthermore, it is another object of the invention to provide a semiconductor package, which mounts a semiconductor element or chip onto a substrate by using the above-described composite balls.

Hitherto, for obtaining metal balls from fine metal particles, there is a plasma sphere-forming apparatus.

The present inventors have discovered that in the case of using the plasma sphere-forming apparatus, for obtaining spheres of large sizes, there is a considerable inferiority from the point of efficiency but for obtaining fine spheres of copper having particle sizes of not larger than 100 $\mu$m, the apparatus is sufficiently effective in industrial production.

That is, the present inventors have found that the powdery particles obtained by the plasma sphere-forming apparatus are almost complete spheres, the particle size distribution is very narrow, pores are not detected in any spheres randomly selected, and even spheres having pores can be removed in the subsequent screening step, and have accomplished the present invention.

According to one aspect of the invention, there is provided a semiconductor package of a semiconductor device mounted a semiconductor element and also micro balls as electric contact points, in which the micro balls are composed of composite micro balls equipped with an electrically conductive film on the circumferences of core balls. The core balls have a sufficiently good rolling property with diameters of from 30 to 100 $\mu$m. The diameter accuracy thereof is excellent. The electrically conductive film is equipped with a solder plated layer having a thickness of at least 10 $\mu$m uniformly formed on the outer peripheral surface thereof is obtained. That is, in the aspect of the invention, the above-described composite micro balls are mounted to construct such that the dimensional accuracy of the Z axis of the package can be precisely controlled. In the invention, the Z axis of the package shows the axis showing the height direction to be mounted.

Also, according to the another aspect of the invention, there is provided a semiconductor package of a semiconductor device mounted a semiconductor element and also micro balls as electric contact points, in which the micro balls are composed of composite micro balls equipped with an electric conductive film on the circumferences of core balls. The core balls have a sufficiently good rolling property with diameters of from 30 to 100 μm and contain at least 90% balls having the diameter accuracy of within ±3 μm. The electrically conductive film is equipped with a solder plated layer of at least 20 μm uniformly covering the circumferences of the core balls is obtained. That is, in the aspect of the invention, the composite micro balls are mounted to construct such that the dimensional accuracy of the Z axis of the package can be precisely controlled.

According to the still another aspect of the invention, there is provided a method of producing a semiconductor package of a semiconductor device mounted a semiconductor element and also micro balls as electric contact points, in which the micro balls are composed of composite micro balls equipped with an electric conductive film on the circumferences of core balls. The core balls have a sufficiently good rolling property with diameters of from 30 to 100 μm. The diameter accuracy thereof is excellent. The electrically conductive film is equipped with a solder plated layer having a thickness of at least 10 μm uniformly formed on the outer peripheral surface and also equipped with composite micro balls having a SnAg or SnAg-based solder plated layer formed on the core balls under a high current density of from 5 to 10 A/dm$^2$, which results in forming a precise and stabilized plated layer to keep the Z axis at a high accuracy is obtained.

Also, according to the yet another aspect of the invention, there is provided a method of producing a semiconductor package of a semiconductor device mounted a semiconductor element and also micro balls as electric contact points, in which the micro balls are composed of composite micro balls equipped with an electric conductive film on the circumferences of core balls. The core balls have a sufficiently good rolling property with diameters of from 30 to 100 μm. The diameter accuracy thereof is excellent. The electrically conductive film is equipped with a solder plated layer having a thickness of at least 10 μm uniformly formed on the outer peripheral surface and equipped with composite micro balls having a PbSn or PbSn-based solder plated layer formed on the core balls under the conditions of reducing a brightener to ⅓ or lower and a low current density of at most 0.5 A/dm$^2$, which results in forming a precise and stabilized plated layer to keep the Z axis at a high accuracy is obtained.

Also, according to a further aspect of the invention, there is provided a copper core composite micro ball assembly composed of plural micro balls connecting to the circuits of the chips of a package of a semiconductor device mounting a semiconductor element, in which each of the micro balls comprises a core ball, a first layer on a surface of the core ball, a second layer formed on the first layer, and the third layer formed on the second layer. The second layer consists of Sn. The third layer is a surface layer and consists of Ag. Herein, Ag is not more than 4% of Sn.

Also, according to the still further aspect of the invention, there is provided an inspection and selection system, which is an apparatus of selecting micro balls by inspecting the diameter accuracy of the micro balls mounted on a semiconductor package, equipped with a color tone detecting device of carrying out a color tone inspection by a camera by irradiating the micro balls with a semi-spherical illumination, a profile decision processing device of carrying out decision processing of the profile of the outer periphery by image superposing of plural times, and a sub-pixel processing device of carrying out sub-pixel processing is obtained. In this case, in the inspection and selection system of the invention, the system is constituted such that the micro balls are obtained at a measurement-guaranteed accuracy of ±2 μm in diameter and the accuracy of the Z axis direction of a package in which the micro balls are mounted is improved.

Also, according to a yet further aspect of the invention, there is provided a copper-core composite micro ball assembly composed of plural micro balls connecting the circuit of the chip of a package of a semiconductor device mounting a semiconductor element, in which the micro balls are equipped with core balls and a solder plated layer formed on the circumferences thereof. The core balls have a sufficient rolling property with a diameter of from 30 to 100 μm. The diameter accuracy thereof is excellent. The solder plated layer uniformly covers at least 10 μm.

Also, according to the another aspect of the invention, there is provided a copper-core composite micro ball assembly composed of plural micro balls joining a semiconductor element to the circuit of the chip of a package of a semiconductor device mounting the semiconductor element, in which the micro balls are equipped with core balls and a solder plated layer formed on the circumferences thereof. The plural core balls each has a sufficiently good rolling property with a diameter of from 30 to 100 μm and contains at least 90% the core balls having the diameter accuracy of within ±3 μm. The solder plated layer uniformly covers the core balls at least 20 μm.

Also, according to the still another aspect of the invention, there is provided a method of producing a semiconductor package for preparing a semiconductor element by applying wiring circuits to a wafer in the lump, in which micro balls are mounted before joining a substrate. At mounting a semiconductor element, a copper-core composite micro ball assembly is mounted. The copper-core composite micro ball assembly is composed of plural micro balls joining to the circuit of the chip of the package of a semiconductor device mounting the semiconductor element. The micro balls are equipped with core balls and a solder plated layer formed on the surface thereof. The core balls have a sufficient rolling property with a diameter of from 30 to 100 μm. The diameter accuracy thereof is excellent, and the solder plated layer is uniformly covered at least 10 μm.

Also, according to the yet another aspect of the invention, there is provided a method of producing a semiconductor package for preparing a semiconductor element by applying wiring circuits to a wafer in the lump, in which micro balls are mounted before joining a substrate. At mounting a semiconductor element, a copper-core composite micro ball assembly is mounted. The copper-core composite micro ball assembly is composed of plural micro balls joining to the circuit of the chip of the package of a semiconductor device mounted a semiconductor element. The micro balls are equipped with core balls and a solder plated layer formed on the surface thereof. The core balls have a sufficient rolling property with a diameter of from 30 to 100 μm and contain at lease 90% the core balls having the diameter accuracy thereof of within ±3 μm. The solder plated layer uniformly covers the core balls at a thickness of at least 20 μm.

BRIEF DESCRIPTION OF THE DRAWINGS

The file of this patent containes at least one drawing executed in color.

FIG. 11A and FIG. 11B are views showing a shear test method of a composite micro ball after the reflow process;

FIG. 12 is a graph showing the relation of a high-temperature keeping time and a shear strength;

DESCRIPTION OF THE PREFERRED EMBODIMENTS

Then, the present invention will be described in detail.

First, before stating the preferred examples of the invention, a conventional CSP will be described for a better understanding of the present invention,.

Figure 1:
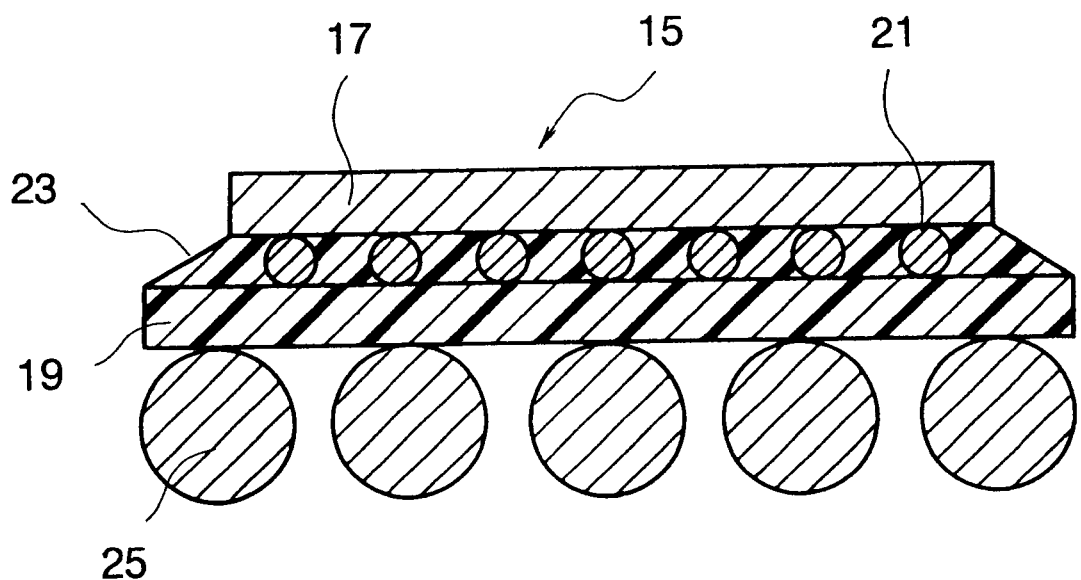
FIG. 1 is a view for use in describing an example of a conventional CSP connected in a flip chip technique.

Referring to FIG. 1, the illustrated conventional CSP 15 has a semiconductor chip 17 electrically connected to a wiring substrate 19. The wiring substrate 19 is formed by ceramics or a synthetic resin. The wiring substrate 19 has a conductive pattern formed on the surface thereof and is electrically connected to the semiconductor chip 17 via micro balls 21 called flip chip balls (FC-Ball) placed between the wiring substrate 19 and the semiconductor chip 17. In the illustrated example, bonded portions between the semiconductor chip 17 and the wiring substrate 19 are covered with an insulating synthetic resin 23. On the other hand, the other surface side of the wiring substrate 19 is mounted on one surface of a substrate or an electric part (not shown) via micro balls 25 called ball grid array balls (BGA-Ball).

The examples of the invention will be described with reference to FIGS. 2 to 14.

Figure 2:
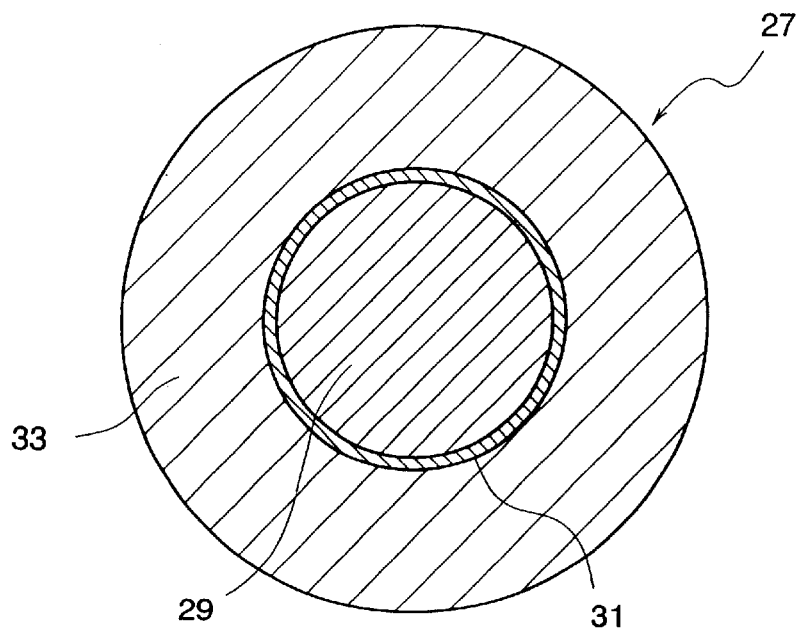
FIG. 2 is an enlarged cross-sectional view for use in describing a composite micro ball of an embodiment of the invention.

In FIG. 2, the composite micro ball 27 can be used as each flip chip ball 21 or each grid array ball 25 illustrated in FIG. 1. The composite micro ball 27 has a copper-core ball 29 and a solder plated layer 33 formed on the surface of a copper-core ball 29 via a nickel (Ni) plated layer 31. The nickel plated layer 31 serves as an underlying layer and is operable as a reaction preventing layer of the solder and copper.

The copper-core ball 29 is sufficiently excellent in the electric conductivity and has a diameter of from 30 to 100 $\mu$m, with a high-accuracy size of ±3 $\mu$m, and preferably ±2 $\mu$m. Also, the solder plated layer 33 at the periphery thereof is formed at a thickness of at least 20 $\mu$m and the thickness accuracy of the solder plated layer 33 is preferably about ±1 $\mu$m. Such a composite micro ball 27 has the following features.

First, the composite micro ball 27 is high in the heat conductivity and the electric conductivity and has a higher joining property than a (soft) solder even at high temperature for a long time. The illustrated composite micro ball 27 has the Ni-plated layer 31 between the core ball 29 and the solder plated layer 33 and serves as the reaction preventing layer of the solder and copper, as mentioned before. Also, the real sphericity is good and the variation of the diameters is very small in the illustrated composite micro ball 27. Also, the rolling property thereof is good. In addition, the composite micro ball has the uniform solder plated layer 33 giving a good self alignment.

Then, a method of producing or manufacturing the composite micro ball 27 of FIG. 2 will be explained.

First, by the use of a plasma sphere-forming apparatus, each copper-core ball 29 was prepared. Such a plasma sphere-forming apparatus is not suitable for effectively forming a comparative large size of spherical balls in a high efficiency. However, it has been found out that the plasma sphere-forming apparatus is very effective to form fine spheres of copper having particle sizes of not larger than 100 $\mu$m,. As a result, the powdery particles obtained have complete spheres. The particle size distribution of the powdery particles is very narrow. Pores are not detected in any spheres optionally selected. Undesirable particles could be also removed in the following screening step.

Then, the particles obtained above were repeatedly sieved at least twice by a non-knitted or unwoven mesh, for example, α-Mesh, manufactured by Kyushu Hitachi Maxel, Ltd. like a copper foil of a punching metal shape. Thereafter, a rotating inclined screening treatment (angle of inclination: 6 degree) was carried out. Thus, it was confirmed that particles made of copper core balls have a good surface accuracy of the peripheral surfaces, without any hindrances, such as attachments, depressions, etc. The rotating inclined screening treatment used in the case was particularly useful for shaping particles of deteriorated spherical shape, two attached particles, or melted particles connected like a string.

Figure 3:
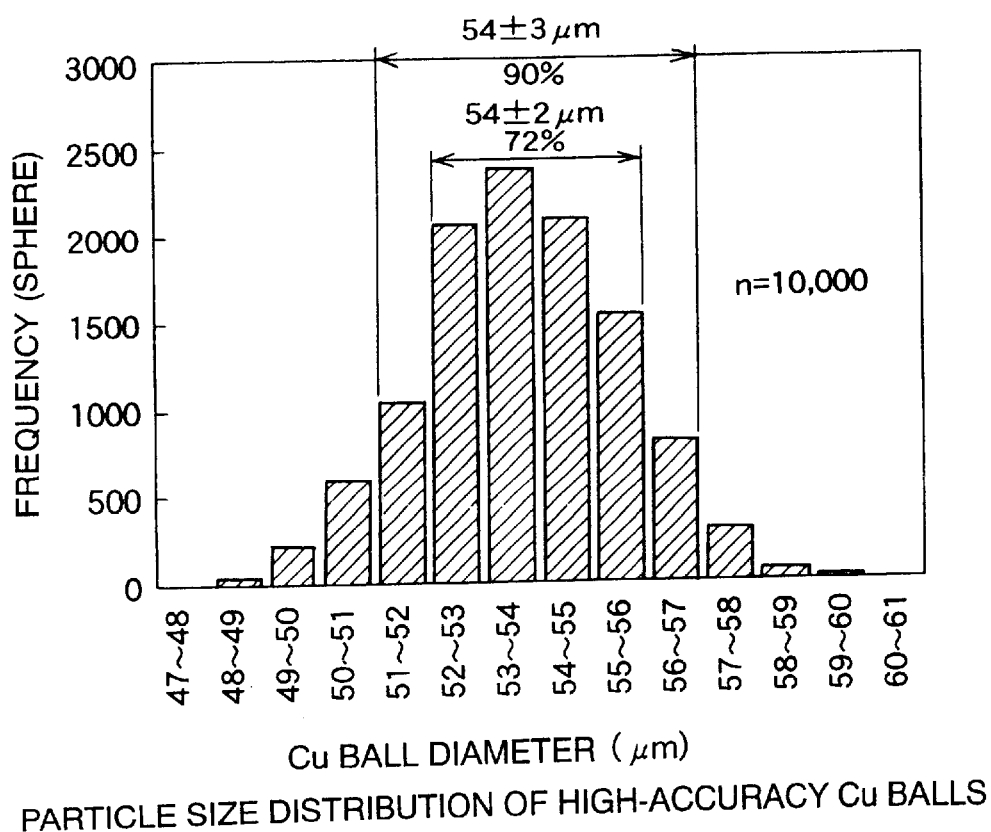
FIG. 3 is a view showing a particle size distribution of copper-core balls after selection processing.

The balls of 54 $\mu$m were treated by the above-described manner to obtain an aggregation of copper core balls subjected to the screening treatment. Thereafter, the aggregation of copper core balls was inspected about the accuracy of the diameters of the copper-core balls. FIG. 3 shows the result of the inspection in connection with the total number of 10000 balls by an inspection selector according to the present invention. As shown in FIG. 3, 90% of the copper core balls belonged to within a range between the balls of 54 $\mu$m±3 $\mu$m while 70% of the copper core balls fell within a range between the balls of 54 $\mu$m±2 $\mu$m. In addition, there was no detection of balls having an extremely large size and an extremely small size, as readily understood from FIG. 3. Also, as the screening step, a screening step of adding a treatment by a selector of high-precisely controlling the gap between two rotating rollers each having a high-precise surface by a laser, etc., in addition to the above-described step is effective to obtain more high-precise balls than the above-described screening step.

Subsequently, plating is applied to the surfaces of the copper-core balls 29 thus screened.

As a plating apparatus of relatively small articles (for example, fine condenser chip), there is a high-speed rotation type barrel plating apparatus (trade name: Flow Through Brator Type RPI, manufactured by Kamimura Kogyo K.K.). In this case, a slurry (materials to be plated are included in slurry together with the bath liquid) is repeatedly mixed each time when the bath repeats the rotation and stop. During rotating, the slurry is brought into contact with a ring-shaped cathode formed at the peripheral portion of the bottom plate to be supplied with an electric current. Thus, uniform plating can be accomplished.

However, in the case of the invention, adhesion of the solder layers to each other is liable to occur on the surfaces deposited in a very early stage. Therefore, it is preferable that the rotation direction is reversed within the plated thickness at least few $\mu$m, and by passing an electric current after the rotation speed reaches to a desired speed. At any rate, it is possible to prevent the plated layers from being close to one another by quickly stopping the rotation and inversely rotating.

As a bath composition, use is made of an alkanol sulfonic acid-base plating liquid generally used. The selection of the plating condition is the most important factor. Now, in the case of a PbSn-base, plating is carried out by reducing the amount of a brightener to about ⅓ of a general case and at a current density of not higher than 0.5 A/dm², and preferably 0.3 A/dm², and by intermittently passing an electric current. Intermittent current supply introduces a condition of preventing the plated layers from being attached simultaneously with the film formation. On the other hand, about SnAg or an SnAg-base, similar effects are also obtained by carrying out similar treatment at a high current density of from 5 to 10 A/dm².

That is, the appropriate condition for allowing electric current to pass through was that the normal rotation and the reversal rotation were repeated until the desired film thickness was obtained by the cycle of acceleration of 1 second, passing of electric current of 2.5 seconds, speed reduction of 1 second, and stopping of 1 second. In addition, it was important that the electric current in the bath was simultaneously controlled such that the solder deposited amount became constant to the balls of from 30 to 100 $\mu$m.

Industrially, the film-deposition rate becomes high to some extent. The stabilized plating condition at least up to 25 $\mu$m of one side was experimentally found by controlling the range of the concentration of a solder (metal components being deposited) in the bath liquid and the solid component concentration of balls in the bath liquid to 40 g/liter±10 g/liter and from 2 to 10 g/liter (from 1,400,000 to 7,000,000 balls with additionally about 1,000,000 of iron-made dummy balls) respectively (a catalogue standard is that the solid component concentration of balls to be plated is 10 g/liter in the commercially available device).

In the fundamental consideration of the solder plating method in the invention, it is important that balls are circulated so that the charging from the cathode is uniformly carried out while avoiding the balls from contacting each other, and further the liquid-contact portions of the balls in the bath become very smooth surface states without having fine projections, cracks, etc. Also, in regard to the deposition of a solder, it is a key that attaching of balls to each other is prevented, and to keep a uniform film formation, charge is intermittently applied and the uniformity of the film forming growth by crushing the solder covered balls in a non-attached state is obtained.

Accordingly, the solder plating method in the invention is not restricted by the kind of the apparatus.

Figure 4:
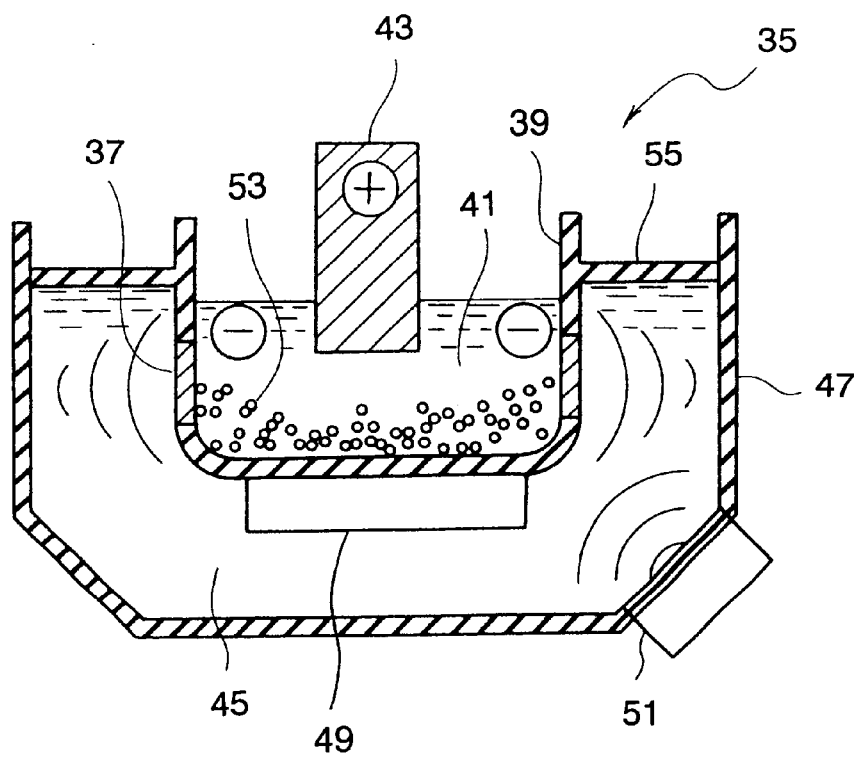
FIG. 4 is a view showing an example of a solder plating method applied to micro balls.

The plating method shown in FIG. 4 is a method called a vibration method, in which a plating liquid 41 is placed in an electrolytic bath 39 equipped with an electrode 37 at the side surface of an apparatus 35 and an anode 43 is immersed in the plating liquid 41. Furthermore, a vessel 47 for containing a cooling water 45 is formed at the outside of the electrolytic bath 39. At the lower side of the bottom of the electrolytic bath 39 and at the outside of the vessel 47 are formed vibrators 49 and 51 respectively. Micro balls 53 are placed in the electrolytic bath 39 and balls are three-dimensionally vibrated by the two vibrators 49 and 51 to restrain attaching of the balls. In addition, the numeral 55 is a supporting member for supporting the electrolytic bath 39.

Figure 5:
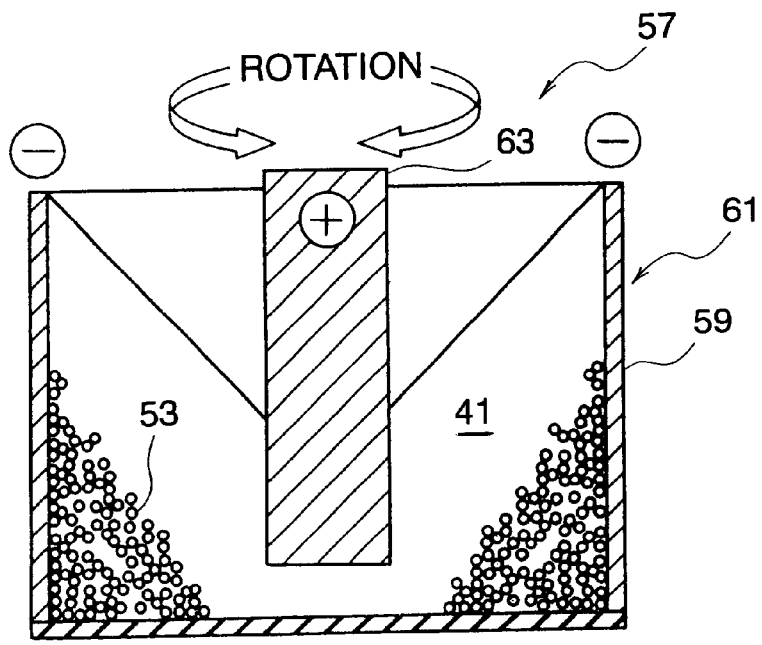
FIG. 5 is a view showing other examples of a solder plating method applied to micro balls.

The plating method shown in FIG. 5 is a method called a rotation method by the use of the apparatus 57, in which a plating liquid 41 is filled in a vessel 61 the side wall portion of which constitutes an electrode 59 and while rotating a cylindrical rotary anode 63, plating is applied to balls 53 placed in the vessel. By repeating a high-speed rotation and stop of the plating bath 61, attaching of the balls each other can be restrained.

By utilzing thes ordinary plating baths, almost a same yield of coating of balls can be obtained.

As a matter of course, it is the same as described above by intermittently supplying an electric current and periodically crushing the balls which are being plated, the liquid-contact portions of the balls are made in very smooth surface states without having fine projections and without cracks and as the result of an experiment, it has been found that the concentration of the plating metal components and the concentration of the metal components of the copper balls may be established to be 40 g/liter±10 g/liter and from 2 to 10 g/liter respectively as in the above-described process. Also, on the other hand, the (soft) solder may be any one of a PbSn-base, an SnAg-base, or an SnZn-base and in each case, a uniform plated film having a thickness of not thicker than 10 $\mu$m is obtained. Also, in addition to such alloy plating, by using Sn as the under coating and by applying thereon Ag plating, the surfaces of the core balls can be uniformly covered.

Figure 6A:
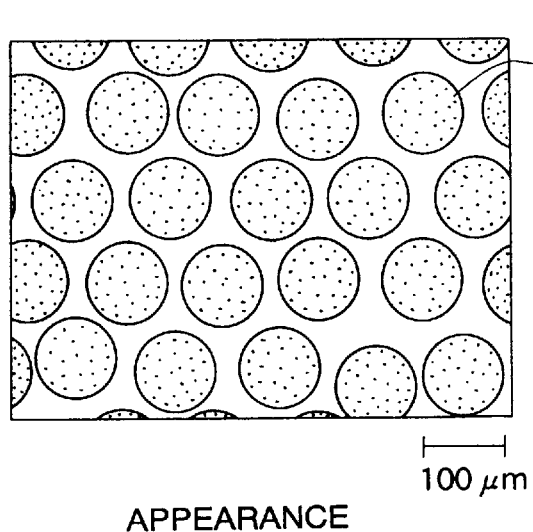
FIG. 6A is a view showing the external appearance of the composite micro balls by an embodiment of the invention.
Figure 6B:
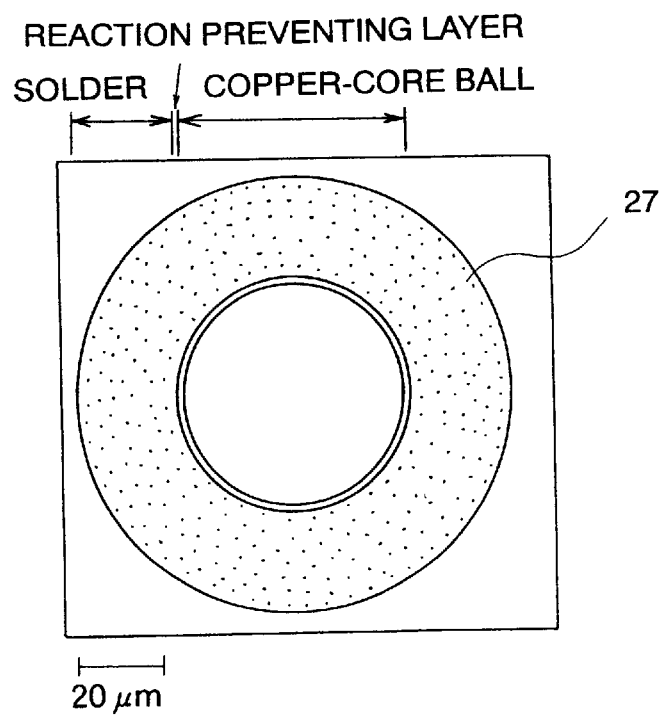
FIG. 6B is an enlarged cross-sectional view of the composite micro ball of FIG. 6A.

After plating, the composite balls were dried to obtain the products having the appearance shown in FIG. 6A. Also, as shown in FIG. 6B the cross-section of the composite ball obtained, the plated film was uniformly formed and the rolling property had no problem.

Also, as a matter of course, pores are not detected and it can be said that a hard plated layer is formed on each ball. In commercially available copper-core solder covered balls having diameters of from 600 to 800 $\mu$m, the diameters have dispersion of several tens $\mu$m as well as a good circular cross-section as shown in FIG. 6B (in the ball having the diameter of not larger than 100 $\mu$m ) is not obtained. (See, Totan Products Information, P1, No. C025/Solder composite (copper-core) micro ball for electronic device, published by Tokyo Tungsten K.K., Nov. 16, 1999).

Figure 7:
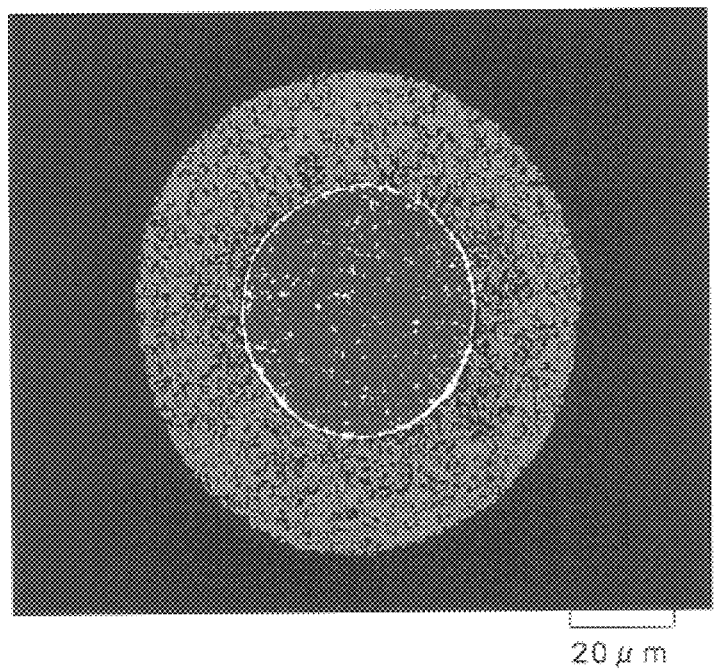
FIG. 7 is an enlarged cross-sectional view of a composite micro ball by an embodiment of the invention.
Figure 8:
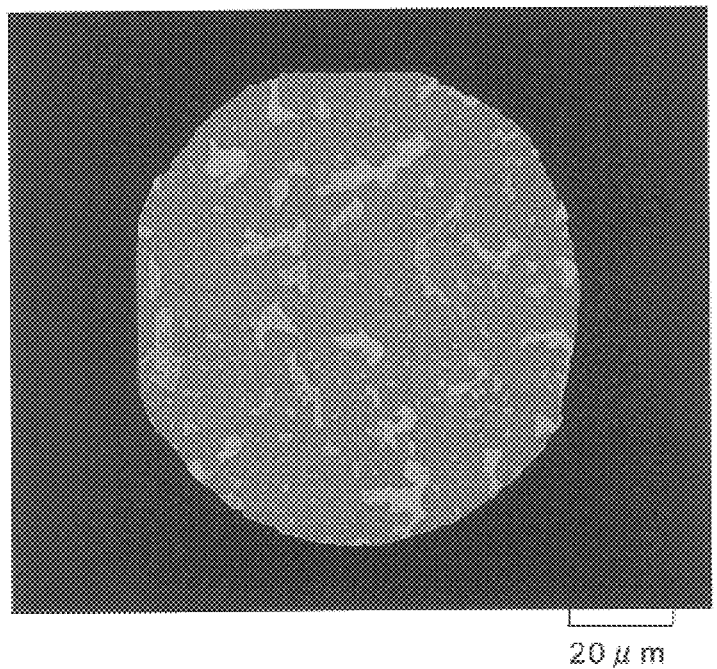
FIG. 8 is an enlarged cross-sectional view showing a commercially available all solder ball of prior art.

From the comparison of FIG. 7 and FIG. 8, in regard to the texture, as compared with the commercially available all solder-made ball (fine product commercially available at present), the solder layer formed on the micro ball by an embodiment of the invention has a uniform texture and there is no concern with the temperature dispersion at reflowing. In addition, the coated layer is a good layer having small solder texture and having no pores.

In addition, in regard to plating to balls, about the balls having the particle sizes (diameters) of from 300 to 650 μm, a good accuracy has been attained in commercially available products. Also, to balls having a particle size of 125 μm, a thick film could be easily formed but for balls having a particle size of 80 μm, the balls were aggregated and thus plating could not be applied. The weight of the ball itself is small, the balls are once brought into contact, and plating proceeds very slightly. When they are shaken, they have no force of being released from each other and they become grape-like forms.

Then, the important factor of the invention is the preparation of the above-described balls and as other important factor, there is a feature of the improvement of the inspection/screening instrument of the accuracy of fine diameters, which have not hitherto been tried.

Particularly, a high-precise inspection apparatus for fine balls of not larger than 100 μm has not yet been commercially available and it was a quite a job to develop such an apparatus. The particularly designed inspection method will be described below which uses image processing of the balls which were prepared and particle-controlled in the above-described steps.

In the screening instrument in an embodiment of the invention, to orientate the balls, a putting-in tray and an inspection tray each having a dimple-shape groove are prepared. Balls to be inspected are filled in the groove of the former tray by applying a vibration, etc. Then, when the balls are transferred to the latter tray prepared such that the center axes of the dimples completely coincide with each other, the troubles that balls are attached to a flat portions having no dimple and plural balls are mounted on one dimple in a fixed state, which become obstructions in the subsequent work, do not occur.

In the screening instrument of the embodiment of the invention, fine balls were photographed by a camera and based on the images obtained. The inspections of the diameters and the color tones (color densities) of the balls were carried out. For clearly catching the shapes of the balls a hemispherical illumination (LED or an optical fiber, in the case, the former was used) was used to make the surfaces of the balls uniformly illuminate. Furthermore, the exposure time of the camera was more prolonged than usual, ordinary exposure time. The exposure was completed per one image or one photographing from 0.01 to 0.3 second. Images formed by photographing plural times were superposed. The contrast of the image was improved. Also, because for the measurement of the diameters, a sub-pixel method was used which was a method of optically measuring the edge portions, a further improvement of the measurement accuracy was realized. As the results thereof, the resolving power was reached to about 0.55 μm/camera pixel, a guaranteed accuracy of ±2 μm was attained in the diameters, and further, to irregular shapes (depression, projection, crushing), the judgement of the results could be made by ±3 μm.

As the total algorithms, for giving the above-described features, an inspection-screening instrument having a practical usability could be prepared by constituting by several kinds of algorithm specifications of a white surface measurement, a circularity measurement, a density judgement, etc. It could be found that the measurement accuracy of balls obtained by the method was ±2 μm in copper balls of from 30 to 100 μm and the extent of a depression and an irregular shape could be detected at least 2 μm.

Then, the application example of composite micro balls by an embodiment of the invention is described with reference to FIGS. 9A and 9B.

Figure 9A:
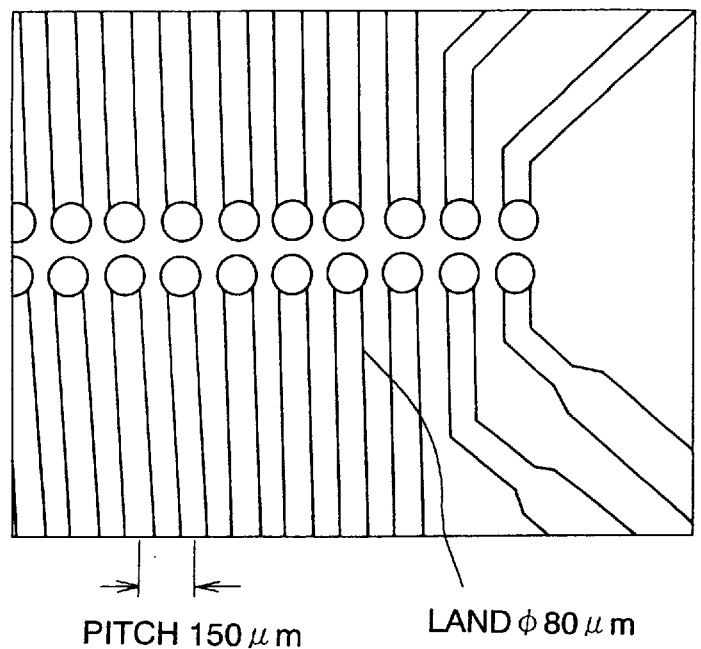
FIG. 9A is a view disposing micro balls before a reflow process.
Figure 9B:
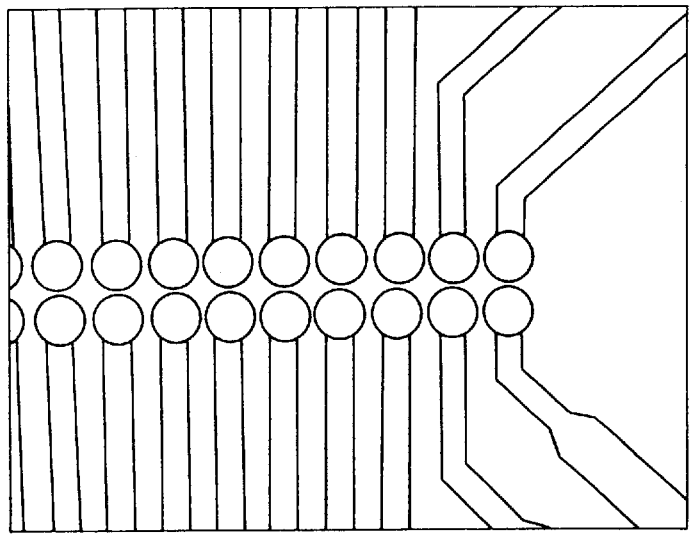
FIG. 9B is a view showing the state after the reflow process.

Referring to FIG. 9A, when the above-described micro balls were mounted on lands having a diameter of 80 μm arranged at a pitch of 150 micron pitch on a trial-produced substrate and reflow for 30 seconds at 250° C. in an argon atmosphere. As the result thereof, it was found that good self alignments as shown in FIG. 9B were obtained.

Figure 10:
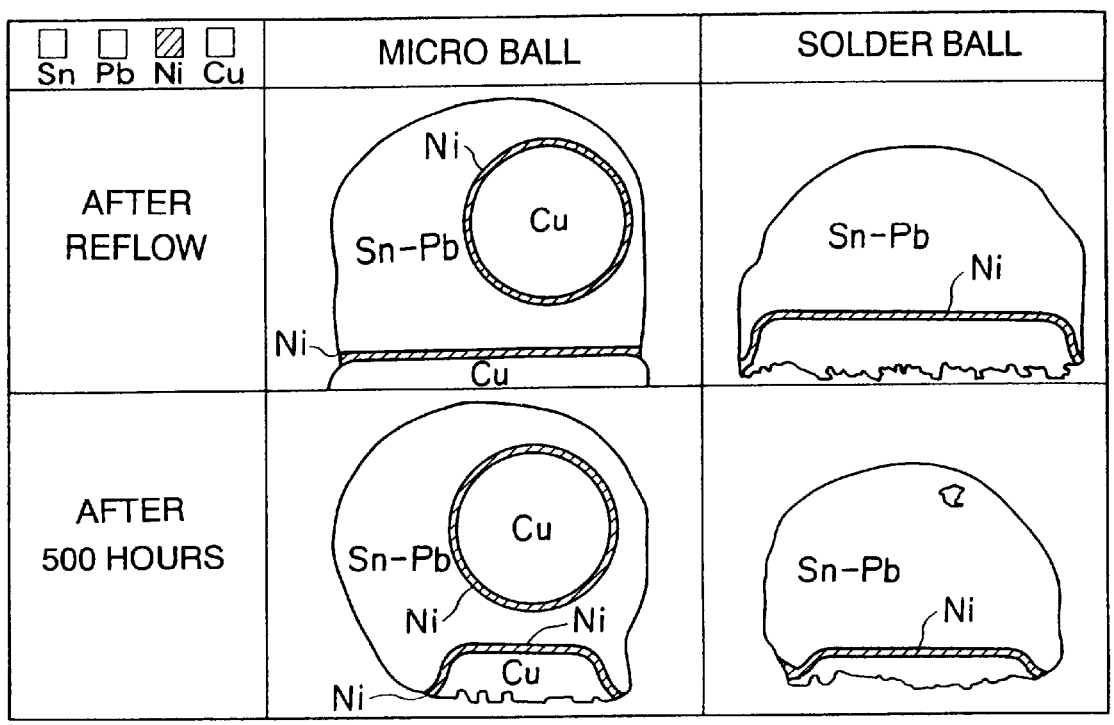
FIG. 10 is views showing cross-sections of jointed portions kept at a high temperature after the reflow process, together with the cases of solder balls.

Referring to FIG. 10, it was found that in the reflow composite micro ball of the invention, after mounted on a pad, the composite micro ball could keep the stability without causing the reaction of copper of the core and the solder after passing 500 hours at 150° C.

Referring to FIG. 11A, in a shear strength test method of a reflow composite micro ball, a ball 69 was cut off in a horizontal direction from the joint portion 67 to a pad 65. In FIG. 11B, the strength in the case and the cross section 69 were observed. This is an example of the actual proof experiment for knowing whether or not a brittleness occurs by the formation of the diffusion layer of Sn/Cu described above.

Referring to FIG. 12, it can be seen that the composite micro ball having an Ni underlying layer between the copper-core ball and the solder plated layer is clearly excellent in the shear strength as compared with the micro ball having no such underlying layer.

Figure 13:
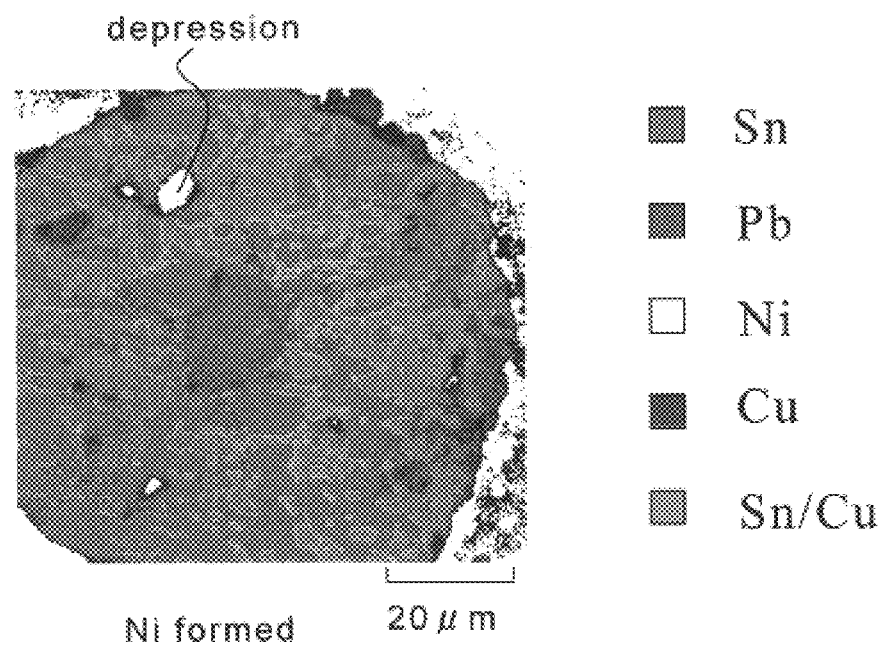
FIG. 13 is a cross-sectional view showing the results of shear test and also showing the cross section of a micro ball with forming Ni layer.
Figure 14:
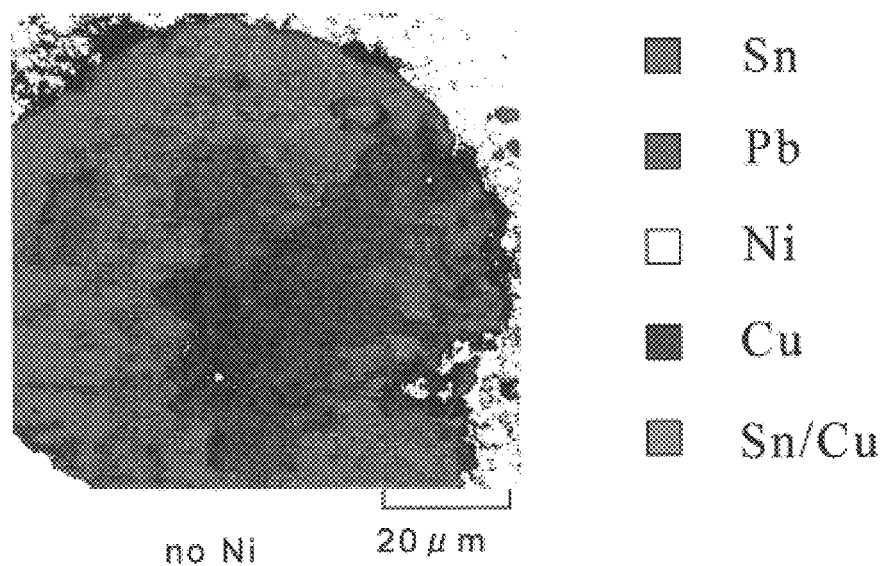
FIG. 14 is a cross-sectional view showing the results of shear test and also showing the cross section of a micro ball without forming Ni layer.

Also, from the comparison of FIG. 13 and FIG. 14, the effect of the Ni-coating is similarly seen.

Then, the composite micro balls of the embodiment of the invention and solder balls were subjected to a high-temperature high-humidity test practiced as a standard test under the conditions of a temperature of 85° C., a humidity of 85%, a time of 500 hours, and bias voltages of 3.6 V and 5.5 V. The results of the high-temperature high-humidity bias test are shown in following Table 1.

TABLE 1

| High-Temperature High-Humidity Bias Test | | |
|---|---|---|
| | Bias Voltage | |
| | 3.6 V | 5.5 V |
| Composite Micro Ball | 0/30 | 0/30 |
| Solder Ball (Comparative Example) | 0/30 | 0/30 |

Test conditions: Temperature 85° C., temperature 85%, Time 500 hours

From the results shown in Table 1 described above, it could be proved that the micro balls by the embodiment of the invention were sufficiently useful as mounting parts.

Usually, each of a substrate and a chip has a warp and a deformation to some extent at mounting. Only by executing press-forming, a limit is present for largely improving the parallelism between the substrate and the chip and the coplanarity of the whole bumps. Under the circumstances, consideration is made about adding an additional step, such as a step of lapping the chip, etc.

Taking this into consideration, it is noted that some troubles practically take place in the conventional method in connection with a mounting method which belongs to the next generation and which has a possibility of three-dimensionally mounting. According to the invention, the dimensional accuracy of the Z-axis can be greatly improved and thus it can be said that the invention is very useful for practical use. Also, in addition of a (soft) solder (PbSn-base, SnAg-base, SnZn-base) alloy plating, for example, by using Sn as an underlying layer, the surfaces of core balls can be uniformly covered as in the case of solder alloy plating. Thus, the dimension of the Z-axis of the package can be ensured.

Furthermore, a plurality of solder layers, such as Sn and Ag layers, may be individually formed on the copper-core ball by composite plating. With this structure, a package can be constructed which is electrically and thermally not inferior to the case of above-described alloy plating.

As described above, the composite micro balls formed by coating a solder of at least 10 μm on the surfaces of core balls from 30 to 100 μm can realize a package having a pad pitch not larger than 200 μm. Furthermore, the composite micro balls include neither extremely large nor small balls and at least 90% of the core balls have the diameter accuracy of ±3 μm. Such composite micro balls serve to assemble a package which has a pad pitch not larger than 90 μm. The value of the pad pitch inevitably relates to the mounting density. As the wiring pitch, high-density mounting is attained by various improvements of designing and is not always shown by a pad pitch only.

However, as the parameter showing the utilization of the invention to industry and the mounting density of the invention, the expression of the pad pitch is used.

As the results described above, it can be said that the composite micro balls of the invention which have copper-core balls having particle sizes not larger than 100 μm can be very expected for the inner bump of a package in next generation high-density mounting. It is also expected that a high-density package having a very high reliability can be provided.

Also, on the other hand, it can be said that in the prober of a semiconductor inspecting apparatus, composite micro balls of the invention can be used.

As described above, the present invention provides core balls which have particle sizes not larger than 100 μm and which are excellent in the rolling property and the production method thereof.

Also, according to the invention, composite micro balls covered with a solder layer of at least 20 μm on the surfaces of the above-described core balls and the production method thereof can be provided.

Furthermore, the present invention provides a semiconductor package which mounts a semiconductor element by using the above-described composite micro balls.

What is claimed is:

1. A semiconductor package for use in mounting a semiconductor element by micro balls which are operable as electric contact points, wherein the micro balls are composed of composite micro balls each of which has a core ball and an electrically conductive film covered on the core ball, each of the core balls having a diameter between 30 and 100 μm, and a sufficient rolling property with a predetermined diameter accuracy, the electrically conductive film being formed by a solder plated layer having a thickness of at least 10 μm uniformly formed on the outer peripheral surface thereof, the dimensional accuracy of the Z axis of the package being precisely controlled when the composite micro balls are mounted.

2. The semiconductor package according to claim 1, wherein the core balls consist of at least one selected from a group consisting of copper, gold, and an alloy containing at least one thereof, each having a good electrical conductivity.

3. The semiconductor package according to claim 1, wherein the solder plated layer is composed of at least one selected from a group consisting of a PbSn-base solder, an SnAg-base solder, and an SnZn-base solder.

4. The semiconductor package according to claim 3, wherein the solder plated layer comprises a first layer of Sn and a second layer of Ag formed on the first layer.

5. The semiconductor package according to claim 1, further comprising an under plating layer of Ni formed on the core ball.

6. The semiconductor package according to claim 1, wherein the semiconductor package is constructed such that the composite micro balls can be mounted at a pad pitch of 200 μm or lower or 90 μm or lower.

7. A semiconductor package for use in mounting a semiconductor element by micro balls which are operable as electric contact points, wherein each micro balls are composed of composite micro balls each of which has a core ball and an electric conductive film on the core ball;

the core balls having a sufficient rolling property with diameters kept between 30 and 100 μm while at least 90% of the core balls have the diameter accuracy ranged within ±3 μm;

the electrically conductive film being formed by a solder plated layer having a thickness of at least 20 μm uniformly covering the outer peripheral surface of the core balls;

the composite micro balls being mounted with the dimensional accuracy of the Z axis of the package precisely controlled.

8. The semiconductor package according to claim 7, wherein the core balls consist of at least one selected from a group consisting of copper, gold, and an alloy containing at least one thereof, each having a good electrical conductivity.

9. The semiconductor package according to claim 7, wherein the solder plated layer consists of at least one selected from a group consisting of a PbSn-base solder, an SnAg-base solder, and an SnZn-base solder.

10. The semiconductor package according to claim 7, wherein the solder plated layer comprises a first layer of Sn and a second layer of Ag formed on the first layer.

11. The semiconductor package according to claim 7, further comprising an under plating layer of Ni formed on the core ball.

12. The semiconductor package according to claim 8, wherein the semiconductor package is constructed such that the composite micro balls are mounted at a pad pitch of 200 μm or lower or 90 μm or lower.

13. A copper-core composite micro ball aggregating comprising a plurality of micro balls to be bonded to a semiconductor chip, each of the micro balls having a core ball, a first layer formed on the core ball, a second layer formed on the first layer, and a third layer formed on the second layer as a surface layer, the second layer consisting of Sn, the third layer consisting of Ag which is not more than 4% of Sn.

14. An inspection and screening system for inspecting the diameter accuracy of micro balls mounted on a semiconductor package and screening the micro balls, comprising a color tone detecting device of carrying out a color tone detection by a camera by irradiating the micro balls with a hemispherical illumination, a profile judgment processing device of carrying out judgment processing of the profile of the outer periphery by superposing images of plural times, and sub pixel processing device of carrying out sub pixel processing, and being constituted such that about the micro balls, the measurement guaranteed accuracy of ±2 µm in the diameter is obtained, and the accuracy of the Z axis direction of the package mounting the micro balls can be improved.

15. A solder plated copper-core composite micro ball aggregation composed of plural micro balls for boding to a circuit of a semiconductor chip, each of the micro balls having a core ball and a solder plated layer formed on each core ball, the core balls having a sufficient rolling property with the diameters of from 30 to 100 um and a predetermined diameter accuracy;

the solder plated layer being uniformly formed at a thickness of at least 10 µm.

16. A solder plated copper-core composite micro ball aggregation composed of plural micro balls for joining to the circuit of the chip of a package of semiconductor device mounted a semiconductor element, wherein the micro balls have core balls and solder plated layers formed on the core balls;

each of the core balls having a sufficient rolling property with the diameters of from 30 to 100 µm while at least 90% of the core balls have the diameter accuracy ranged within ±3 µm, the solder plated layer uniformly covering each of the core balls at a thickness of at least 20 µm.

* * * * *